US012591039B2

(12) United States Patent
Wen et al.

(10) Patent No.: US 12,591,039 B2
(45) Date of Patent: Mar. 31, 2026

(54) RECTENNA ARRAY FOR DETECTING POWER RADIATED PATTERN OF MICROWAVE OR MILLIMETER-WAVE SIGNALS

(71) Applicant: Keysight Technologies, Inc., Santa Rosa, CA (US)

(72) Inventors: Zhu Wen, Beijing (CN); Xiong Bin Liao, Beijing (CN); Li Cao, Beijing (CN); Zi Quan Bai, Beijing (CN); Sheng Qi Zhang, Beijing (CN)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 331 days.

(21) Appl. No.: 18/244,151

(22) Filed: Sep. 8, 2023

(65) Prior Publication Data

US 2024/0159865 A1      May 16, 2024

(30) Foreign Application Priority Data

Nov. 11, 2022    (CN) .......................... 202211413387.4

(51) Int. Cl.
| *G01S 7/40* | (2006.01) |
| *G01R 29/10* | (2006.01) |

(52) U.S. Cl.
CPC ............ *G01S 7/4008* (2013.01); *G01R 29/10* (2013.01)

(58) Field of Classification Search
CPC ..... G01R 29/10; G01S 7/4008; G01S 13/931; H04B 1/006; H04B 17/102; H04B 1/0007; H01Q 1/3233; H01Q 21/00
See application file for complete search history.

(56) References Cited

U.S. PATENT DOCUMENTS

| 4,660,041 | A | * | 4/1987 | Maples | ..................... G01S 7/40 |
| | | | | | 342/170 |
| 7,583,074 | B1 | * | 9/2009 | Lynch | ..................... G01S 13/89 |
| | | | | | 324/120 |
| 9,985,733 | B1 | * | 5/2018 | Lee | ..................... H04B 17/102 |
| 10,978,810 | B2 | | 4/2021 | Lee et al. | |
| 11,035,950 | B2 | * | 6/2021 | Lee | ..................... G01S 7/4026 |
| 11,050,496 | B2 | * | 6/2021 | DaSilva | ................. G01R 29/10 |
| 11,408,993 | B2 | * | 8/2022 | Lee | ......................... G01S 13/89 |

(Continued)

OTHER PUBLICATIONS

Chaouki Hannachi et al., "A Highly Sensitive Broadband Rectenna for Low Power Millimeter-wave Energy Harvesting Applications," 2018 IEEE Wireless Power Transfer Conference (WPTC), Montreal, QC, Canada, 2018, pp. 1-4.

*Primary Examiner* — Peter M Bythrow

(57)            ABSTRACT

A system is provided for measuring a power radiated pattern of an incident radio frequency (RF) signal indicating spatial distribution characteristics of a device under test (DUT). The system includes multiple antenna elements arranged in an array, where the antenna elements include antennas and diodes coupled to the antennas, respectively. Each antenna has a radar cross-section (RCS) that is too small for the antenna elements to operate in a reflect mode. Each diode is zero biased, such that the diodes receive the incident RF signal through the antennas to which the diodes are respectively coupled, and rectify the incident RF signal to DC voltages that are proportional to power of the incident RF signal, enabling the antenna elements to operate in a detect mode.

20 Claims, 3 Drawing Sheets

(56) References Cited

U.S. PATENT DOCUMENTS

| | | | | |
|---|---|---|---|---|
| 11,520,008 | B2 * | 12/2022 | Lee | G01S 7/4052 |
| 2017/0244503 | A1 * | 8/2017 | Perndl | H04B 17/318 |
| 2018/0076906 | A1 * | 3/2018 | Naseef | G01R 27/28 |
| 2018/0109331 | A1 * | 4/2018 | Nikitin | G01R 29/10 |
| 2019/0041496 | A1 * | 2/2019 | Salvesen | G01S 7/4052 |
| 2020/0136263 | A1 * | 4/2020 | Lee | G01S 13/755 |
| 2020/0271707 | A1 * | 8/2020 | Gallhauser | H04B 17/102 |
| 2020/0292605 | A1 * | 9/2020 | Heuel | G01R 29/10 |
| 2020/0304216 | A1 * | 9/2020 | Cooper | H01Q 21/062 |
| 2021/0055383 | A1 * | 2/2021 | Lee | G01S 13/325 |
| 2021/0055411 | A1 * | 2/2021 | Lee | G01S 13/89 |
| 2021/0184362 | A1 * | 6/2021 | Hong Loh | H01Q 1/48 |
| 2022/0216927 | A1 * | 7/2022 | Gallhauser | H04B 17/23 |
| 2022/0268886 | A1 * | 8/2022 | Shamsinejad | G01S 7/4004 |

* cited by examiner

115

RECTENNA ARRAY FOR DETECTING POWER RADIATED PATTERN OF MICROWAVE OR MILLIMETER-WAVE SIGNALS

CROSS REFERENCE TO RELATED APPLICATION

A claim for priority under 35 U.S.C. § 119 is made to Chinese Patent Application No. 202211413387.4, filed on Nov. 11, 2022. The entire disclosure of Chinese Patent Application No. 202211413387.4 is hereby specifically incorporated by reference in its entirety.

BACKGROUND

Automotive radars are currently deployed in automobiles for assistance in parking and collision avoidance. Additionally, automotive radars are incorporated in driverless automobiles, currently being developed. Automotive radars offer the unique ability to identify obstacles and determine relative velocity due to the Doppler effect, even in low visibility conditions, such as fog and rain. Each car may be equipped with as many as a dozen automotive radar modules around its perimeter. Thus, automobile manufacturers are installing millions of radar units inside car bodies (in the bumpers, doors, etc.). Therefore, the ability to inexpensively and accurately test devices under test (DUTs) in automotive radar systems, such as automotive radars, base stations, and user equipment, for example, is becoming increasingly important to successful deployment of such systems.

Automotive radars operate using microwave or millimeter-wave radio frequency (RF) signals, typically at or near 77 GHz, for example. Power radiated pattern is a key RF performance matrix of automotive radar systems, describing spatial distribution characteristics of the DUTs. Conventionally, the power radiated pattern is measured using a probe antenna configured to detect the radiated power of DUT in one or more directions. The power radiated pattern may be obtained by mechanically moving and/or rotating either the probe antenna or the DUT in order to scan the spatial distribution of the radiated power in different directions. However, this type of measurement system has a very slow measurement speed due to the mechanical scans.

Another measurement method involves an array of rectenna (rectifying antenna), each of which is configured to operate in a detect mode for receiving and detecting RF signals transmitted by the DUT and a reflect mode for reflecting the transmitted RF signals back to the DUT. Different bias voltages are applied to control whether each of the rectenna elements operates in the detect mode or the reflect mode. However, application of the bias voltage requires a dedicated circuit to enable the rectennas to switch between the detect mode and the reflect mode, which increases the complexity of the design and the cost of the system. Further, in order to support the reflect mode, the rectenna elements must be built upon low gain patch antennas to provide requisite radar cross sections (RCS s), as opposed to high gain antennas having narrow RCS s, thereby degrading the sensitivity of the rectenna array.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
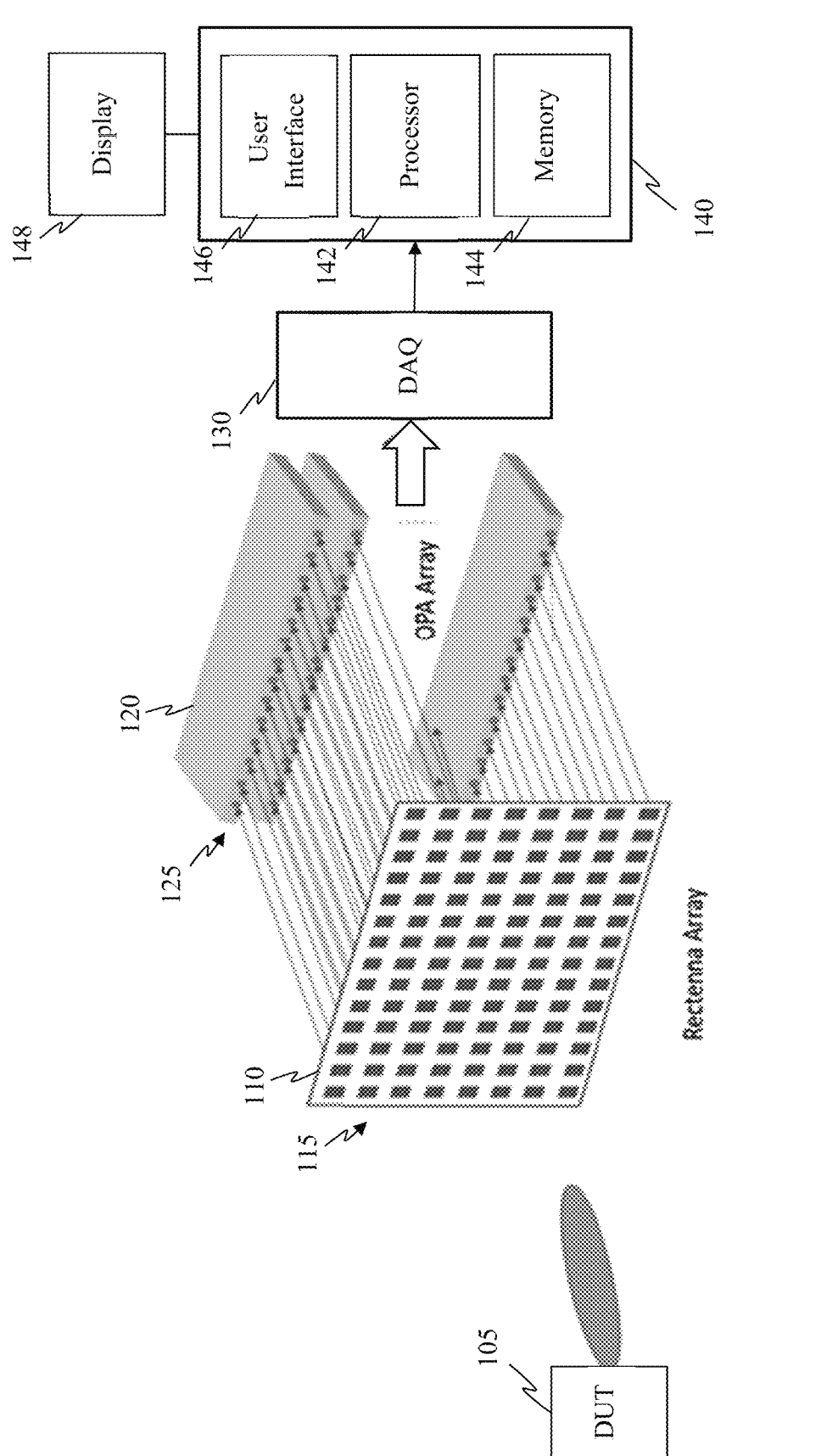
FIG. 1 is a simplified block diagram showing a system for measuring power radiated pattern of an incident RF signal indicating spatial distribution characteristics of a DUT, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components. In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Generally, a rectenna array is built on an array of rectenna elements configured to function only in a detect mode, and not in a reflect mode, during testing of a device under test (DUT), such as an automotive radar device, for example. When working in the detect mode, the rectenna array is able to get a snapshot of the radiated pattern very quickly, which significantly speeds up the power radiated pattern measurement. The detect mode rectenna array significantly improves efficiency of measuring power radiated patterns by replacing mechanical scans by fast snapshots. Also, the detect mode rectenna array reduces difficulties in rectenna element design, system integration and the system cost. In addition, sensitivity of the detect mode rectenna array is significantly improved by using co-planar high gain antennas, which otherwise cannot be used in systems configured to test in both detect and reflect modes.

According to a representative embodiment, a system is provided for measuring a power radiated pattern of an incident radio frequency (RF) signal indicating spatial distribution characteristics of a DUT. The system includes multiple antenna elements arranged in an array, where the antenna elements include multiple antennas and multiple diodes coupled to the multiple antennas, respectively. Each antenna has a radar cross-section (RCS) that is too small for the antenna elements to operate in a reflect mode. Each diode has a fixed zero bias, such that the diodes receive the incident RF signal through the antennas to which the diodes are respectively coupled, and rectify the incident RF signal to DC voltages that are proportional to power of the incident RF signal, enabling the antenna elements to operate in a detect mode for detecting radiated power.

FIG. 1 is a simplified block diagram showing a system for measuring power radiated pattern of an incident RF signal indicating spatial distribution characteristics of a DUT, according to a representative embodiment. The incident RF signal may be a microwave signal or millimeter-wave signal (e.g., about 77 GHz) used in automotive radar, for example.

Referring to FIG. 1, system 100 includes a rectenna array 110 including multiple detect-mode-only antenna elements 115 (rectennas) arranged in rows and columns of the rectenna array 110. The antenna elements 115 are configured to receive and detect RF signals transmitted by DUT 105, and to directly convert radiated power of the RF signal to corresponding rectified voltage levels in the detect mode. Measurements of the detected RF signals are performed in a far-field distance with respect to the DUT 105, so that the far-field power radiated pattern of the DUT 105 is achieved directly. That is, the antenna elements 115 of the rectenna array 110 are placed in the far-field distance of the DUT 105 to measure the far-field power radiated pattern of DUT 105. The antenna elements 115 are not configured to operate in the reflect mode, as discussed below. Although the rectenna array 110 shows 112 antenna elements 115, it is understood that the rectenna array 110 may include more or fewer antenna elements in different arrangements of rows and columns without departing from the scope of the present teachings.

The antenna elements 115 are arranged in rows and columns to form the rectenna array 110. The spacing between adjacent antenna elements 115 is related to the desired spatial resolution of the power radiated pattern. Also, the spacing may vary depending on location in the rectenna array 110. For example, the spacing between antenna elements 115 may be denser in the area of the rectenna array 110 illuminated by the main beam of the DUT 105 than in other areas of rectenna array 110.

Figure 2A:
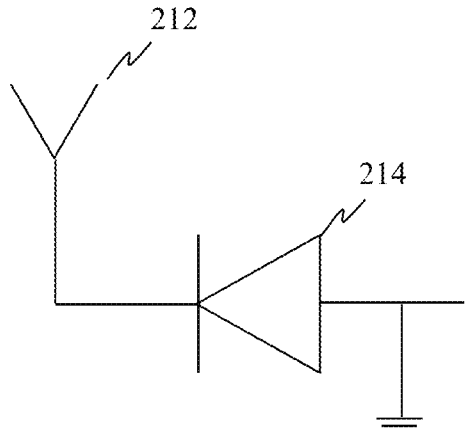
FIG. 2A is a simplified circuit diagram of an antenna element of the rectenna array, according to a representative embodiment.

FIG. 2A is a simplified circuit diagram of an antenna element of the rectenna array, according to a representative embodiment. Referring to FIG. 2A, antenna element 115 includes an antenna 212 and a diode 214 coupled to the antenna 212 (antenna-coupled diode). The diode 214 has a fixed (permanent) zero bias, indicated by the input of the diode 214 being coupled to ground. The diode 214 may be a zero bias Schottky diode, for example, although other types of zero bias diodes may be incorporated without departing from the scope of the present teachings.

The zero bias diode 214 rectifies the incident RF signal to DC voltages that are proportional to the power of the incident RF signal locally received by the antenna 212, enabling the antenna elements 115 to operate in the detect mode. Thus, at zero bias, the diode 214 effectively operates as a square law detector, and the input signal power of the incident RF signal is derived directly by measuring the output rectified DC voltages. That is, the output DC voltages are measured and used to derive directly the input RF signal power. Consequently, with the whole rectenna array 110, the spatial distribution of the radiated power from the DUT 105, i.e., the power radiated pattern, can be measured.

Since the zero bias of the diode 214 is fixed, there is no need for additional circuitry, such as a switch or other control circuitry, for example, for applying different biases to the input of the diode 214. The fixed zero bias of the diode 214 prevents the system 100 from operating in the reflect mode, which requires forward biasing, but the cost of the system 100 is reduced and the overall operations are simplified.

Figure 2B:
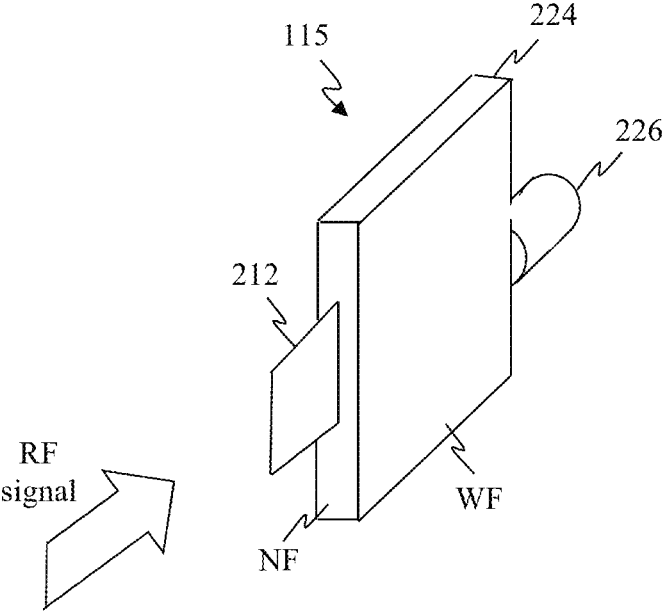
FIG. 2B is a perspective view of a co-planar, broadband slot antenna, according to a representative embodiment.

In the depicted embodiment, the antenna 212 is a co-planar high gain antenna, such as a Vivaldi antenna or other type of co-planar, broadband slot antenna, for example. FIG. 2B is a perspective view of an antenna element including a co-planar, broadband slot antenna, according to a representative embodiment. The antenna 212 is able to provide high gain RF signals received from the DUT 105, which improves sensitivity of the antenna array 110 as compared to an antenna array comprising low gain antennas, such as patch antennas, needed for operation in the reflect mode.

Further, as a co-planar, broadband slot antenna, the physical structure of the antenna 212 is arranged substantially parallel to the direction of the incident RF signal in order to receive and detect the RF signal, as shown in FIG. 2B. In particular, the antenna element 115 includes the antenna 212 (e.g., Vivaldi antenna) extending from a printed circuit board (PCB) 224 along a longitudinal axis. The antenna 212 is arranged on the PCB 224 opposite an RF connector 226, where the zero bias diode 214 (not shown in FIG. 2B) is connected between the antenna 212 and the RF connector 226. In the depicted configuration, a narrow face (NF) of the PCB 224 faces the DUT 105 and the incident RF signal, while a wide face (WF) of the PCB 224 faces sideways with relative to the DUT 105 and the incident RF signal. Therefore, the antenna 212 (and thus the antenna element 115) has a small RCS as seen from the DUT 105, which prevents the antenna 212 from being used in the reflection mode. However, since the antenna element 115 is fixed in the detect mode, the inadequate RCS is inconsequential, while the improvement in signal quality using the co-planar high gain antenna is substantial.

Referring again to FIG. 1, the system 100 further includes operational power amplifier (OPA) array 120, data acquisition (DAQ) module 130, and processing unit 140. The OPA array 120 includes OPAs 125 in OPA channels arranged in rows and columns respectively corresponding to the antenna elements 115 of the rectenna array 110, such that each OPA 125 connects to one antenna element 115 of the rectenna array 110. Because the rectified voltage from each antenna element 115 is low, the corresponding OPA 125 is configured to boost the rectified voltage, amplifying the outputs from all the antenna elements 115.

The DAQ module 130 includes at least one analog to digital converter (ADC) for digitizing the amplified, rectified voltages output by the OPAs 125, respectively, to provide one or more digitized output signals. Depending on the required updating rate for detecting and measuring the radiated power, the DAQ module 130 may incorporate either multiple ADCs for faster updating rates or a multiplexer (MUX) coupled to a single ADC for slower updating rates. The multiple ADCs may be equal in number to the antenna elements 115 so that the rectified voltage from each of the antenna elements 115 is digitized by a dedicated ADC, thereby providing multiple digitized output signals. The single ADC digitizes the rectified voltages from all of the antenna elements 115 after being combined by the MUX to provide a single digitized output signal.

Figure 3A:
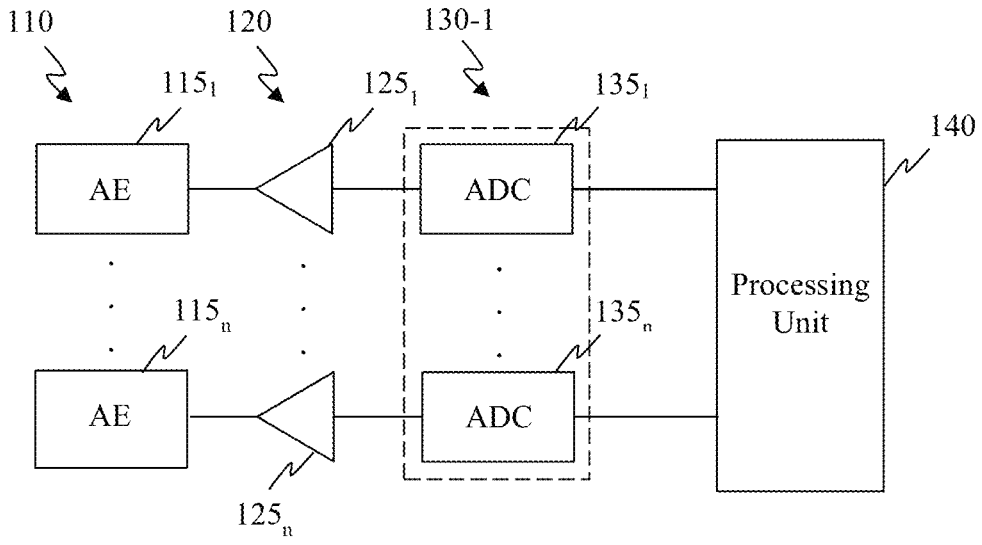
FIG. 3A is a simplified block diagram of a data acquisition (DAQ) module having multiple analog to digital converters (ADCs), according to a representative embodiment.
Figure 3B:
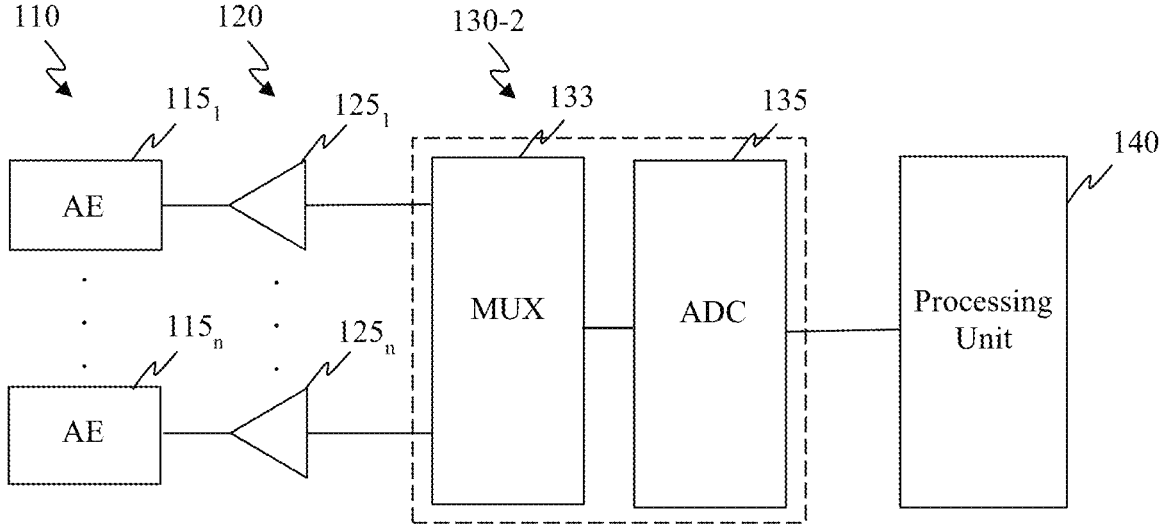
FIG. 3B is a simplified block diagram of a DAQ module having a multiplexer coupled to a single ADC, according to a representative embodiment.

FIGS. 3A and 3B are simplified block diagrams of the DAQ module 130, according to representative embodiments. Referring to FIG. 3A, DAQ module 130-1 includes multiple ADCs $135_1$ to $135_n$ respectively corresponding to antenna elements $115_1$ to $115_n$ in the rectenna array 110 and OPAs $125_1$ to $125_n$ in the OPA array 120, where n is the total number of antenna elements 115 in the rectenna array. The individual outputs of the ADCs $135_1$ to $135_n$ are provided to the processing unit 140. Referring to FIG. 3B, DAQ module 130-2 includes MUX 133 a coupled to a single ADC 135. The MUX 133 includes input channels respectively corresponding to antenna elements $115_1$ to $115_n$ in the rectenna array 110 and OPAs $125_1$ to $125_n$ in the OPA array 120, and is configured to combine the RF signals of the input channels into a signal multiplexed output signal. The ADC 135 receives and digitizes the multiplexed output signal. Generally, the DAQ module 130-1 is more expensive to implement than the DAQ module 130-2 due to the larger number of ADCs (ADCs $135_1$ to $135_n$). However, as mentioned above, the DAQ module 130-1 is able to provide a higher updating rate than the DAQ module 130-2 due to the availability of the individual sampling rates of the ADCs $135_1$ to $135_n$.

Of course, any combination of DACs and MUXs may be incorporated without departing from the scope of the present teachings, depending on the required updating rates, where the more ADCs translates into faster sampling generally. For example, each row of antenna elements 115 in the rectenna array 110 may have a separate MUX and ADC combination for digitizing the rectified voltages from that particular row.

In any of the configurations, the DAQ module 130 provides the one or more digitized output signals to the processing unit 140 for further processing, which includes determining the power radiated pattern of the incident RF signal based on the digitized output signal(s). Because the diodes 214 are zero biased, the DC voltage output by the diodes 214 may be directly converted to input signal power by the processing unit 140 to get the power radiated pattern of the DUT 105. Ideally, the relationship between input signal power (p) (in dB) of the incident RF signal and DC voltage (v) (in dB) output from the diode 214 may be expressed as a linear equation: $p=(a_1 *v)+a_0$, where $a_1$ and $a_0$ are constant factors which may be determined by evaluating the current-voltage (IV) characteristic curve of the diode 214, enabling the processing unit 140 to directly convert the DC voltage (v) to the input signal power (p). When further considering non-ideal tolerance in the IV characteristic curve of the diode 214, the relationship between input signal power (p) (in dB) of the incident RF signal and the DC voltage output (v) (in dB) from diode 214 may be expressed as a polynomial equation: $p=a_0+(a_1 *v)+(a_2 *v^2)+ \ldots$, where the polynomial factors $a_0$, $a_1$, $a_2$, ... may also be determined by measuring the I-V characteristic curve.

The processing unit 140 may be further configured to perform calibration of the power radiated pattern to compensate for inconsistencies between the digitized output signal(s) and the power of the incident RF signal detected by the antenna elements 115. The inconsistencies may be caused by inconsistency factors, including inconsistent antenna gains by of the antenna elements 115, inconsistent spatial distances between each of the antennas in the rectenna array 110 and the DUT 105, inconsistent impedance matching between the antennas and corresponding diodes of in each of the antenna elements 115, respectively, and/or inconsistent diode IV characteristics of the diodes in the antenna elements 115, for example.

In an embodiment, calibration data are measured prior to the power radiated pattern measurement. For example, antenna gain inconsistency of all antenna elements 115 may be obtained by measuring antenna gain of each antenna element 115. Distance inconsistency may be obtained by measuring distance between each antenna element 115 and the DUT 105. Impedance mismatch inconsistency may be obtained by applying a signal source with fixed RF signal power to each antenna element 115 (antenna-diode pair), and measuring the DC voltage output. Lastly, the IV characteristics of each diode 214 may be obtained by changing the power of the signal source and measuring the DC voltage output to obtain the diode IV characteristics inconsistency. Then, in the power radiated pattern measurement, the processing unit 140 applies the pre-measured inconsistency factors mentioned above to the conversion process of deriving input signal power from each antenna element 115 to compensate for the inconsistencies of the rectenna array 110 for calibration.

The processing unit 140 may include a processor 142 and memory 144 for storing instructions executable by the processor 142, as well as a user interface 146 and a display 148 to enable user (test engineer) interaction. The processing unit 140 may operate as a standalone device or may be connected, for example, via a network connection, to other computer systems or peripheral devices.

The processor 142 is representative of one or more processing devices, and is configured to execute software instructions to perform functions as described in the various embodiments herein. The processor 142 may be implemented by a general purpose computer, a central processing unit (CPU), a graphics processing unit (GPU) a digital signal processor (DSP), one or more processors, microprocessors or microcontrollers, a state machine, a programmable logic device, field programmable gate arrays (FPGAs), application specific integrated circuits (ASICs), or combinations thereof, using any combination of hardware, software, firmware, hard-wired logic circuits, or combinations thereof. The term "processor," in particular, encompasses an electronic component able to execute a program or machine executable instructions. References to "a processor" should be interpreted to include more than one processor or processing core, as in a multi-core processor, and/or parallel processors. A processor may also refer to a collection of processors within a single computer system or distributed among multiple computer systems, such as in a cloud-based or other multi-site application. Programs have software instructions performed by one or multiple processors that may be within the same computing device or which may be distributed across multiple computing devices.

The memory 144 may include a main memory and/or a static memory, where such memories may communicate with each other and the processor 142 via one or more buses. The memory 144 stores instructions used to implement some or all aspects of methods and processes described herein, including the methods described above with reference to FIGS. 1 and 5, for example. The memory 144 may be implemented by any number, type and combination of random access memory (RAM) and read-only memory (ROM), for example, and may store various types of information, such as software algorithms, data based models including ANN and other neural network based models, and computer programs, all of which are executable by the processor 142. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blue-ray disk, a universal serial bus (USB) drive, or any other form of storage medium known in the art.

The memory 144 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 144 may store software instructions and/or computer readable code that enable performance of various functions. The memory 144 may be secure and/or encrypted, or unsecure and/or unencrypted.

The user interface 146 may include a user and/or network interface for providing information and data output by the processor 142 and/or the memory 144 to the user and/or for receiving information and data input by the user. That is, the user interface 146 enables the user to enter data and to control or manipulate aspects of the processes described herein, and also enables the processor 142 to indicate the effects of the user's control or manipulation. The user interface 146 may connect one or more user interfaces, such as a mouse, a keyboard, a mouse, a trackball, a joystick, a haptic device, a microphone, a video camera, a touchpad, a touchscreen, voice or gesture recognition captured by a microphone or video camera, for example, or any other peripheral or control to permit user feedback from and interaction with the computer workstation 605. The user interface 146 may further include one or more of ports, disk drives, wireless antennas, or other types of receiver circuitry.

The display 148 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 148 may also provide a graphical user interface (GUI), in combination with the user interface 146, for displaying and receiving information to and from the user.

Accordingly, the system according to the various embodiments herein enables efficient operation of the rectenna array in detecting incident microwave or millimeter-wave signals by zero biasing the diode of each antenna element (antenna-diode pair), without the need for switching circuitry for switching to the reflect mode. The antennas incorporated into each of the antenna elements are not restricted with regard to RCS since they will not be used in the reflect mode, enabling the antenna to be implemented using co-planar high gain antennas having low RCSs.

The illustrations described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

Aspects of the disclosure may be embodied as an apparatus, method or computer program product. Accordingly, aspects of the disclosure may take the form of an entirely software embodiment (including firmware, resident software, micro-code, etc.) or an embodiment combining software and hardware aspects that may all generally be referred to herein as a "circuit," "module" or "system." Furthermore, aspects of the disclosure may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

What is claimed:

1. A system for measuring a power radiated pattern of an incident radio frequency (RF) signal indicating spatial distribution characteristics of a device under test (DUT), the system comprising:

a plurality of antenna elements arranged in an array, wherein the plurality of antenna elements comprise a plurality of antennas and a plurality of diodes coupled to the plurality of antennas, respectively, and wherein each antenna of the plurality of antennas has a radar cross-section (RCS) that is too small for the plurality of antenna elements to operate in a reflect mode, and wherein each diode of the plurality of diodes has a fixed zero bias, such that the plurality of diodes receive the incident RF signal through the plurality of antennas to which the plurality of diodes are respectively coupled, and rectify the incident RF signal to DC voltages that are proportional to power of the incident RF signal, enabling the plurality of antenna elements to operate in a detect mode for detecting radiated power.

2. The system of claim 1, wherein each antenna of the plurality of antennas comprises a high gain antenna.

3. The system of claim 2, wherein each co-planar high gain antenna comprises a co-planar, broadband slot antenna.

4. The system of claim 3, wherein each co-planar, broadband slot antenna comprises a Vivaldi antenna.

5. The system of claim 1, further comprising:

a plurality of operational power amplifiers arranged in an array, and configured to amplify outputs of the plurality of antenna elements, respectively;

at least one analog to digital converter (ADC) configured to digitize the amplified outputs from the plurality of operational power amplifiers to provide at least one digitized output signal; and a processing unit configured to determine the power radiated pattern of the incident RF signal based on the at least one digitized output signal from the at least one ADC.

6. The system of claim 5, wherein the power radiated pattern of the incident RF signal comprises a far-field power radiated pattern.

7. The system of claim 5, wherein the processing unit is further configured to perform calibration of the power radiated pattern to compensate for inconsistencies between the at least one digitized output signal and the power of the incident RF signal detected by the plurality of antenna elements, and wherein the inconsistencies are caused by at least one of inconsistent antenna gains of the plurality of antennas, inconsistent spatial distances between each of the plurality of antennas and the DUT, inconsistent impedance matching between the plurality of antennas and the plurality of diodes, respectively, and inconsistent diode IV-characteristics of the plurality of diodes.

8. The system of claim 5, wherein the at least one ADC comprises a plurality of channels configured to receive the amplified outputs from the plurality of operational power amplifiers, respectively, wherein the at least one ADC is configured to digitize the amplified outputs from the plurality of channels to provide the at least one digitized output signal.

9. The system of claim 5, further comprising:

a multiplexer (MUX) configured to multiplex the amplified outputs from the plurality of operational power amplifiers to provide a multiplexed signal, wherein the at least one ADC is configured to receive the multiplexed signal from the MUX via a single channel, and to digitize the multiplexed signal to provide the at least one digitized output signal.

10. The system of claim 1, wherein the incident RF signal comprises a microwave signal or an incident millimeter-wave signal.

11. The system of claim 1, wherein each diode comprises a Schottky diode.

12. The system of claim 1, wherein each antenna is spaced apart from each adjacent antenna in the array of antenna elements in each of two lateral dimensions based on a desired spatial resolution of the power radiated pattern.

13. A system for measuring a power radiated pattern of an incident radio frequency (RF) signal indicating spatial distribution characteristics of a device under test (DUT), the system comprising:

a plurality of antenna elements arranged in an array, wherein the plurality of antenna elements comprise a plurality of antennas and a plurality of diodes coupled to the plurality of antennas, respectively, wherein each antenna of the plurality of antennas comprises a co-planar high gain antenna, and wherein each diode of the plurality of diodes has a fixed zero bias, such that the plurality of diodes receive the incident RF signal through the plurality of antennas to which the plurality of diodes are respectively coupled, and rectify the incident RF signal to DC voltages that are proportional to power of the incident RF signal, enabling the plurality of antenna elements to operate in a detect mode for detecting radiated power.

14. The system of claim 13, wherein each co-planar high gain antenna comprises a Vivaldi antenna.

15. The system of claim 13, further comprising:

a plurality of operational power amplifiers arranged in an array, and configured to amplify outputs of the plurality of antenna elements, respectively;

at least one analog to digital converter (ADC) configured to digitize the amplified outputs from the plurality of operational power amplifiers to provide at least one digitized output signal; and a processing unit configured to determine the power radiated pattern of the incident RF signal based on the at least one digitized output signal from the at least one ADC.

16. The system of claim 15, wherein the power radiated pattern of the incident RF signal comprises a far-field power radiated pattern.

17. The system of claim 15, wherein the processing unit is further configured to perform calibration of the power radiated pattern to compensate for inconsistencies between the at least one digitized output signal and the power of the incident RF signal detected by the plurality of antenna elements.

18. The system of claim 15, wherein the at least one ADC comprises a plurality of channels configured to receive the amplified outputs from the plurality of operational power amplifiers, respectively, wherein the at least one ADC is configured to digitize the amplified outputs from the plurality of channels to provide the at least one digitized output signal.

19. The system of claim 15, further comprising:

a multiplexer (MUX) configured to multiplex the amplified outputs from the plurality of operational power amplifiers to provide a multiplexed signal, wherein the at least one ADC is configured to receive the multiplexed signal from the MUX via a single channel, and to digitize the multiplexed signal to provide the at least one digitized output signal.

20. A system for measuring a power radiated pattern of an incident radio frequency (RF) signal indicating spatial distribution characteristics of a device under test (DUT), the system comprising:

a plurality of antenna elements arranged in an array, wherein the plurality of antenna elements comprise a plurality of antennas and a plurality of diodes coupled to the plurality of antennas, respectively, wherein each antenna of the plurality of antennas comprises a co-planar high gain antenna, and wherein each antenna of the plurality of antennas has a radar cross-section (RCS) that is too small for the plurality of antenna elements to operate in a reflect mode, so that the plurality of antenna elements operate only in a detect mode for detecting radiated power.

* * * * *